(12) United States Patent
Pruitt (10) Patent No.: US 7,902,665 B2
(45) Date of Patent: Mar. 8, 2011

(54) SEMICONDUCTOR DEVICE HAVING A SUSPENDED ISOLATING INTERCONNECT

(75) Inventor: David Alan Pruitt, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 231 days.

(21) Appl. No.: 12/202,835

(22) Filed: Sep. 2, 2008

(65) Prior Publication Data

US 2010/0052120 A1   Mar. 4, 2010

(51) Int. Cl.
    *H01L 23/34* (2006.01)
(52) U.S. Cl. ......... 257/725; 257/666; 257/686; 257/777; 257/E23.031; 257/E23.085
(58) Field of Classification Search .................. 257/93, 257/685, 723, 777, E25.005, E25.006, E25.021, 257/E25.027, 666–667, 678–733, E23.001–E23.194; 438/109, FOR. 368, FOR. 426
    See application file for complete search history.

(56) References Cited

U.S. PATENT DOCUMENTS

| | | | |
|---|---|---|---|
| 3,922,385 A | 11/1975 | Konantz et al. | |
| 4,103,267 A | 7/1978 | Olschewski | |
| 4,780,795 A | 10/1988 | Meinel | |
| 5,409,866 A | 4/1995 | Sato et al. | |
| 5,763,952 A | 6/1998 | Lynch et al. | |
| 5,861,662 A | 1/1999 | Candelore | |
| 5,926,358 A | 7/1999 | Dobkin et al. | |
| 5,959,462 A * | 9/1999 | Lum ............................ | 324/765 |
| 6,052,289 A | 4/2000 | Schoenfeld et al. | |
| 6,242,800 B1 | 6/2001 | Munos et al. | |
| 6,369,454 B1 | 4/2002 | Chung | |
| 6,380,048 B1 | 4/2002 | Boon et al. | |
| 6,703,692 B1 | 3/2004 | Pruitt | |
| 6,770,982 B1 | 8/2004 | Liou | |
| 6,841,421 B2 | 1/2005 | Aono et al. | |
| 6,847,101 B2 | 1/2005 | Fjelstad et al. | |
| 6,905,954 B2 | 6/2005 | Hedler et al. | |
| 7,002,238 B2 | 2/2006 | Behzad | |
| 7,045,831 B2 | 5/2006 | Narazaki | |
| 7,064,442 B1 | 6/2006 | Lane et al. | |
| 7,075,329 B2 | 7/2006 | Chen et al. | |
| 7,132,314 B2 | 11/2006 | Matsunami | |

(Continued)

FOREIGN PATENT DOCUMENTS

DE  10 2005 054 872 A1   5/2007

(Continued)

OTHER PUBLICATIONS

United States Office Action Issued in U.S. Appl. No. 12/003,883, mailed Nov. 12, 2009.

(Continued)

*Primary Examiner* — Jasmine J Clark
(74) *Attorney, Agent, or Firm* — McDermott Will & Emery LLP (57) ABSTRACT

A semiconductor device is configured to provide current and voltage isolation inside an integrated circuit package. The semiconductor device includes first and second semiconductor dies, a first isolating block positioned on the first semiconductor die, and a second isolating block positioned on the second semiconductor die. The semiconductor device also includes a first interconnect coil having a plurality of wires connecting the first semiconductor die to the second isolating block, and a second interconnect coil having a plurality of wires connecting the second semiconductor die to the first isolating block.

34 Claims, 3 Drawing Sheets

U.S. PATENT DOCUMENTS

| | | |
|---|---|---|
| 7,135,763 B2 | 11/2006 | Stroupe |
| 7,154,165 B2 | 12/2006 | Pruitt |
| 7,154,940 B2 | 12/2006 | Scott et al. |
| 7,447,492 B2 * | 11/2008 | Dupuis .................. 455/333 |
| 2001/0017412 A1 | 8/2001 | Asazu et al. |
| 2001/0040277 A1 | 11/2001 | Lam et al. |
| 2006/0017141 A1 | 1/2006 | Luo et al. |
| 2006/0276155 A1 | 12/2006 | Feldtkeller |
| 2007/0018338 A1 | 1/2007 | Hosseini et al. |
| 2007/0081280 A1 | 4/2007 | Strzalkowski et al. |
| 2009/0032975 A1 | 2/2009 | Do et al. |

FOREIGN PATENT DOCUMENTS

EP     0 418 749 A2     3/1991

OTHER PUBLICATIONS

United States Office Action issued in U.S. Appl. No. 12/003,883, mailed Jun. 22, 2010.

International Search Report and Written Opinion of the International Searching Authority issued in International Patent Applicaiton No. PCT/US2008/088327, mailed Jun. 23, 2009.

* cited by examiner

SEMICONDUCTOR DEVICE HAVING A SUSPENDED ISOLATING INTERCONNECT

TECHNICAL FIELD

The subject matter of this disclosure relates to a suspended isolating interconnect.

BACKGROUND

The subject matter of this disclosure, in one implementation, relates to an isolator circuit for providing current and/or voltage isolation inside an integrated circuit ("IC") package. Isolator circuits are used to couple signals between circuits having different ground reference potentials, and to provide ground reference potential isolation inside IC packages. In some applications, different grounds inside IC packages can have a difference in potential as high as several thousand volts.

Generally, there are three methods for providing isolation between circuits having different ground reference potentials: opto-coupled isolation, transformer-coupled isolation, and capacitively-coupled isolation. Opto-coupled isolation and transformer-coupled isolation are generally disadvantaged in that the coupling devices are relatively bulky and not well suited for use inside an IC package. Capacitors, on the other hand, can be made smaller and be integrated on a semiconductor die.

However, attempts in the past to provide an isolator circuit on a single semiconductor die have been met with problems due to reliability constraints and damage from electrostatic discharging and over voltage breakdown. In particular, it has been found to be difficult to provide silicon dioxide-based suspended isolating interconnects capable of withstanding the high voltage differential commonly encountered in isolator circuits. Similarly, it has been found to be difficult to increase the voltage on a single semiconductor die to extremely high working voltages (e.g., 2000 volts).

SUMMARY

A semiconductor device is configured to provide current and voltage isolation inside an IC package. In one implementation, the semiconductor device may include first and second semiconductor dies; a first isolating block positioned on the first semiconductor die; and a second isolating block positioned on the second semiconductor die. The semiconductor device may also include a first interconnect coil having a plurality of wires connecting the first semiconductor die to the second isolating block, and a second interconnect coil having a plurality of wires connecting the second semiconductor die to the first isolating block.

Implementations of the above general aspect may include one or more of the following features. The first and second interconnect coils may be isolated from each other and suspended. Thus, the first and second interconnect coils may be surrounded by a molding compound and may be configured to carry high voltages. The first and second interconnect coils may be mutually positioned such that capacitance coupling is created between the first and second interconnect coils. Alternatively or additionally, the first and second interconnect coils may be mutually positioned to form a transformer in the semiconductor device.

The first interconnect coil may be connected to a source circuit located on the first semiconductor die and the second interconnect coil may be connected to a load circuit located on the second semiconductor die such that an alternating current applied to the first interconnect coil via the source circuit induces a current or voltage on the second interconnect coil for the load circuit. The plurality of wires of the second interconnect coil may be wrapped around the plurality of wires of the first interconnect coil. Alternatively or additionally, the plurality of wires of the second interconnect coil may be inside the plurality of wires of the first interconnect coil. Alternatively or additionally, the plurality of wires of the second interconnect coil may be adjacent the plurality of wires of the first interconnect coil.

The plurality of wires of the first interconnect coil may include a first wire and a second wire, at one end connected to each other via a first conductive trace positioned on the top surface of the second isolating block and, at another end respectively connected to first and second conductive traces positioned on the top surface of the first semiconductor die, each of the first wire and second wire connecting the first semiconductor die to the second isolating block. Similarly, the plurality of wires of the second interconnect coil may include a first wire and a second wire, at one end connected to each other via a first conductive trace positioned on the top surface of the first isolating block and, at another end respectively connected to first and second conductive traces positioned on the top surface of the second semiconductor die, each of the first wire and second wire connecting the second semiconductor die to the first isolating block.

The plurality of wires of the first interconnect coil further may include a third wire and a fourth wire, at one end connected to each other via a second conductive trace positioned on the top surface of the second isolating block and, at another end the third wire may be connected to the second wire via the second conductive trace positioned on the top surface of the first semiconductor die and the fourth wire may be connected to a third conductive trace positioned on the top surface of the first semiconductor die. Similarly, the plurality of wires of the second interconnect coil further may include a third wire and a fourth wire, at one end connected to each other via a second conductive trace positioned on the top surface of the first isolating block and, at another end the third wire may be connected to the second wire via the second conductive trace positioned on the top surface of the second semiconductor die and the fourth wire may be connected to a third conductive trace positioned on the top surface of the second semiconductor die.

In one implementation, the conductive traces may include nickel-coated copper, nickel-coated aluminum, or aluminum, and the plurality of wires of the first and second interconnect coils may be connected to the conductive traces via ball bonds. The plurality of wires of the first interconnect coil and the plurality of wires of the second interconnect coil may be made of copper, gold, or aluminum.

In another implementation, the first semiconductor die may include thereon a first circuit and the second semiconductor die may include thereon a second circuit such that the first and second circuits communicate with each other though the first and second interconnect coils.

In another implementation, a semiconductor device may include a lead frame including a first set of leads and a second set of leads, the first set of leads being isolated from the second set of leads; a semiconductor die positioned on the lead frame; and an isolating block positioned on the semiconductor die. The semiconductor device may also include a first interconnect coil formed by a first set of wires, the die, and the first set of leads; and a second interconnect coil isolated from the first interconnect coil and formed by a second set of wires, the isolating block, and the second set of leads.

Implementations of the above general aspect may include one or more of the following features. For example, the first and second interconnect coils may be configured to enable a printed circuit board connected to the lead frame to communicate with a circuit located on the semiconductor die. To this end, the first set of leads may include a first lead and a second lead each of which is conductive and connected to the other at its end tip portion, and the first set of wires may include a first wire and a second wire, at one end connected to each other via the first lead and the second lead and, at another end respectively connected to first and second conductive traces positioned on the top surface of the semiconductor die.

The first set of leads may further include a third lead and a fourth lead each of which is conductive and connected to the other at its end tip portion, and the first set of wires may further include a third wire and a fourth wire, at one end connected to the other via the third lead and the fourth lead and, at another end the third wire is connected to the second wire via the second conductive trace positioned on the top surface of the semiconductor die and the fourth wire is connected to a third conductive trace positioned on the top surface of the semiconductor die.

Similarly, the second set of leads may include first, second, third, and fourth leads each of which is conductive and the third and fourth leads connect to each other at their end tip portion, the second set of wires may include first, second, third, and fourth wires. In one implementation, the first and second wires, at one end connect to each other via a first conductive trace positioned on the top surface of the isolating block and, at another end the first wire connect to the first lead and the second wire connect to the third lead. Similarly, the third and fourth wires, at one end connect to each other via a second conductive trace positioned on the top surface of the isolating block and, at another end the third wire connect to the fourth lead and the fourth wire connect to second lead.

The first and second interconnect coils may be isolated from each other and suspended. To isolate the first and second interconnect coils, the first and second interconnect coils may be surrounded by a molding compound. The first and second interconnect coils may be configured to carry high voltages. The first and second interconnect coils may be mutually positioned such that capacitance coupling is created between the first and second interconnect coils.

The first and second interconnect coils may be mutually positioned to form a transformer in the semiconductor device. To this end, the first set of wires of the first interconnect coil may be adjacent to the second set of wires of the second interconnect coil. For example, the first set of wires of the first interconnect coil may be wrapped around the second set of wires of the second interconnect coil. Alternatively, the first set of wires of the first interconnect coil may be inside the second set of wires of the second interconnect coil.

The first interconnect coil may be connected to a circuit located on the first semiconductor die and the second interconnect coil may be connected to a printed circuit board connected to the lead frame, such that the first and second interconnect coils enable the printed circuit board to communicate with the circuit located on the semiconductor die. The conductive traces may include nickel-coated copper, nickel-coated aluminum, or aluminum. The first set of wires of the first interconnect coils may be connected to the conductive traces via ball bonds. Similarly, the second set of wires of the second interconnect coils may be connected to the conductive traces via ball bonds. The first set of wires of the first interconnect coil and the second set of wires of the second interconnect coil may be made of copper, gold, or aluminum.

The details of one or more implementations are set forth in the accompanying drawings and the description below. Other features will be apparent from the description and drawings, and from the claims.

DETAILED DESCRIPTION

In the following detailed description, numerous specific details are set forth by way of examples in order to provide a thorough understanding of the relevant teachings. However, present teachings may be practiced without such details. In other instances, well-known methods, procedures, components, and circuitry have been described at a relatively high-level, without detail, in order to avoid unnecessarily obscuring aspects of the present teachings.

Overview

As is well-known, a transformer is a device that transfers electrical energy from one circuit to another through inductively coupled electrical conductors that affect such a transfer with a change in voltage, current, phase or other electric characteristic. A transformer consists of two or more coils of conducting material, such as wire, wrapped around a core. In particular, it consists of a primary coil and a secondary coil. A changing current applied to the primary coil is transferred to the secondary coil. By adding a load to the secondary coil, one can make the current flow in the transformer, thus transferring electrical energy from one circuit to another.

Described is a technique and a structure for providing a transformer inside an IC package. In particular, the present disclosure teaches first and second interconnect coils mutually positioned to form a transformer within the IC package. In one implementation, the first and second interconnect coils are mutually positioned such that the first interconnect coil connects a first semiconductor die to an isolating block located on a second semiconductor die, and the second interconnect coil connects the second semiconductor die to an isolating block located on a first semiconductor die. This implementation is described with respect to FIGS. 1A-1B.

In another implementation, the first and second interconnect coils are mutually positioned such that the first interconnect coil connects a semiconductor die to a lead frame and the second interconnect coil connects the lead frame to an isolating block located on the semiconductor die. The first interconnect coil may be connected to a source circuit located on the semiconductor die. However, in this implementation, the second interconnect coil may be connected to a load circuit located on a printed circuit board connected to the lead frame, such that alternating current applied to the first interconnect coil via the source circuit induces current or voltage on the second interconnect coil connected to the load circuit. This implementation is described with respect to FIG. 2.

In each implementation, the first interconnect coil may be connected to a source circuit and the second interconnect coil may be connected to a load circuit. For example, in the first implementation, the first interconnect coil may be connected to a source circuit located on the first semiconductor die and the second interconnect coil may be connected to a load circuit located on the second semiconductor such that an alternating current applied to the first interconnect coil via the source circuit induces current or voltage on the second interconnect coil connected to the load circuit.

Description

Figure 1A:
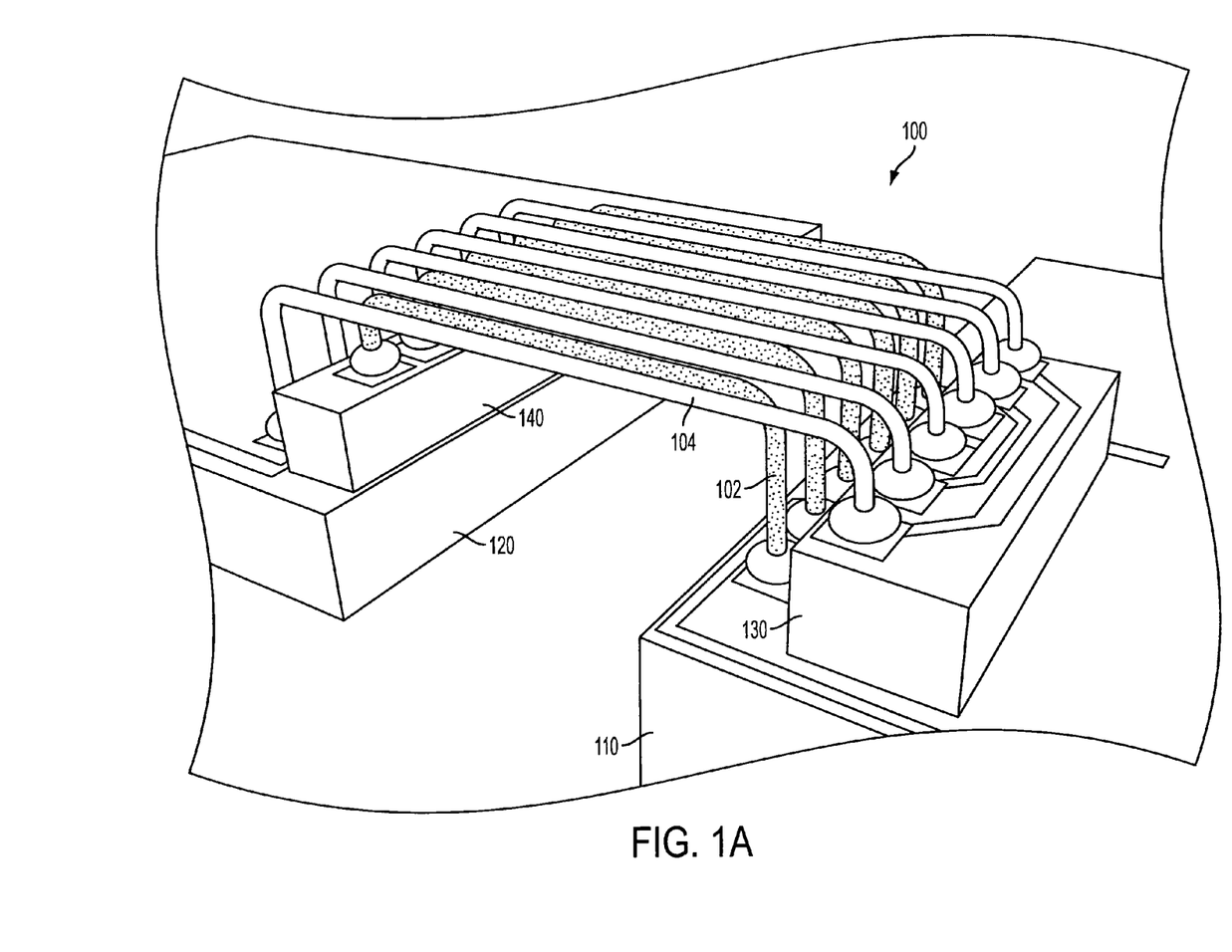
FIGS. 1A-1B illustrate perspective views of an exemplary semiconductor device including two suspended-isolating interconnect coils enabling transfer of electrical energy between circuits on two semiconductor die.
Figure 1B:
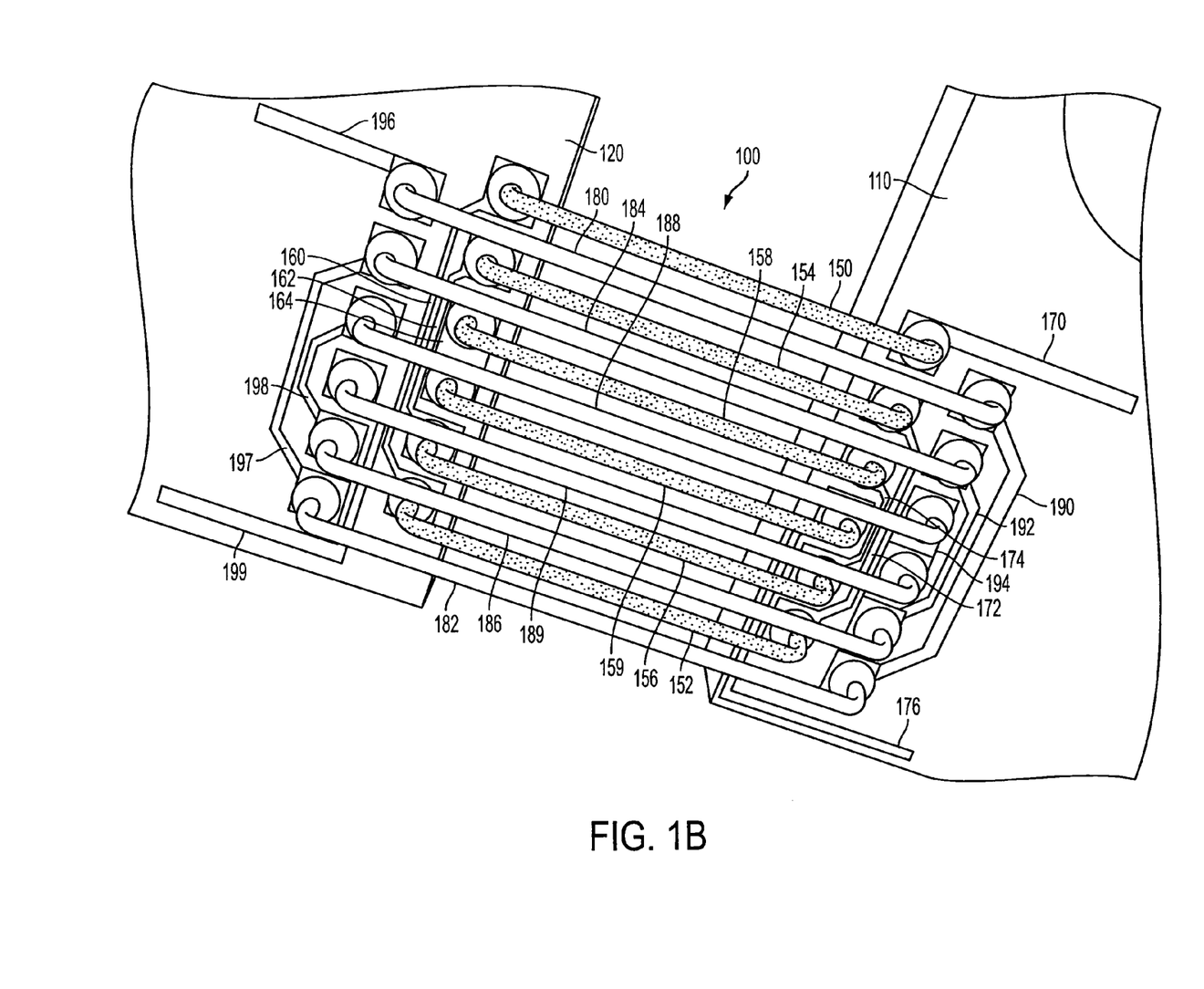

FIGS. 1A-1B illustrate perspective views of an exemplary semiconductor device 100 in accordance with a first implementation including two suspended-isolating interconnect coils enabling transfer of electrical energy between a first circuit located on a first semiconductor die and a second circuit located on a second semiconductor die. The semiconductor device 100 includes a first semiconductor die 110, a second semiconductor die 120, a first isolating block 130, a second isolating block 140, a first interconnect coil 102 having a plurality of wires (shown in dark), and a second interconnect coil 104 having a plurality of wires (shown in light).

The first and second semiconductor dies 110, 120 provide support for first and second isolating blocks 130, 140, respectively. The first isolating block 130 is positioned on first semiconductor die 110 and configured to isolate first semiconductor die 110 from second semiconductor die 120. Second isolating block 140 is positioned on second semiconductor die 120 and is configured to isolate second semiconductor die 120 from first semiconductor die 110.

The semiconductor device 100 includes a first interconnect coil 102 and a second interconnect coil 104. The first interconnect coil 102 includes a plurality of wires connecting first semiconductor die 110 to second isolating block 140. The second interconnect coil 104 includes a plurality of wires connecting second semiconductor die 120 to first isolating block 130. The first and second interconnect coils are mutually positioned to form a transformer inside an IC package.

To this end, the plurality of wires of the second interconnect coil may be adjacent the plurality of wires of the first interconnect coil. For example, the plurality of wires of the second interconnect coil may be wrapped around the plurality of wires of the first interconnect coil. Alternatively, the plurality of wires of the second interconnect coil may be located inside the plurality of wires of the first interconnect coil.

To further illustrate, FIG. 1B is a top view of the two interconnect coils and the manner in which they connect first semiconductor die 110 to second isolating block 140 and connect second semiconductor die 120 to first isolating block 130. The first interconnect coil 102 includes a plurality of wires 150, 152, 154, 156, 158, and 159 connecting first semiconductor die 110 to second isolating block 140. In particular, the plurality of wires of the first interconnect coil includes a first wire 150 and a second wire 152, at one end connected to each other via a first conductive trace 160 positioned on the top surface of second isolating block 140. The other end is respectively connected to first and second conductive traces 170, 172 positioned on the top surface of first semiconductor die 110.

Additionally, the plurality of wires of the first interconnect coil includes a third wire 154 and a fourth wire 156, at one end connected to each other via a second conductive trace 162 positioned on the top surface of second isolating block 140. At the other end, third wire 154 is connected to second wire 152 via second conductive trace 172 positioned on the top surface of first semiconductor die 110 and fourth wire 156 is connected to a third conductive trace 174 positioned on the top surface of first semiconductor die 110. Furthermore, the plurality of wires of the first interconnect coil includes a fifth wire 158 and a sixth wire 159, at one end connected to each other via a third conductive trace 164 positioned on the top surface of second isolating block 140 and, at another end fifth wire 158 is connected to fourth wire 156 via third conductive trace 174 positioned on the top surface of first semiconductor die 110 and sixth wire 159 is connected to a fourth conductive trace 176 positioned on the top surface of first semiconductor die 110.

Similarly, the second interconnect coil 104 includes a plurality of wires 180, 182, 184, 186, 188, and 189 connecting second semiconductor die 120 to first isolating block 130. In particular, the plurality of wires of the second interconnect coil includes a first wire 180 and a second wire 182, at one end connected to each other via a first conductive trace 190 positioned on the top surface of first isolating block 130. The other end is respectively connected to first and second conductive traces 196, 197 positioned on the top surface of second semiconductor die 120.

The plurality of wires of the second interconnect coil includes a third wire 184 and a fourth wire 186, at one end connected to each other via a second conductive trace 192 positioned on the top surface of first isolating block 130. At the other end, third wire 184 is connected to second wire 182 via second conductive trace 197 positioned on the top surface of second semiconductor die 120 and fourth wire 186 is connected to a third conductive trace 198 positioned on the top surface of second semiconductor die 120. The plurality of wires of the second interconnect coil includes a fifth wire 188 and a sixth wire 189, at one end connected to each other via a third conductive trace 194 positioned on the top surface of first isolating block 130. At the other end, fifth wire 188 is connected to fourth wire 186 via third conductive trace 198 positioned on the top surface of second semiconductor die 120 and sixth wire 189 is connected to a fourth conductive wire 199 positioned on the top surface of second semiconductor die 120.

With the foregoing configuration, the first and second interconnect coils form a transformer within the IC package, thereby enabling transfer of electrical energy from one circuit to another through the inductively coupled electrical wires. The inductively coupled electrical wires can affect such a transfer with, for example, a change in voltage, current, phase or other electric characteristics. To illustrate, the first interconnect coil may be connected to a source circuit located on first semiconductor die 110 and the second interconnect coil may be connected to a load circuit located on second semiconductor die 120. The alternating current generated from the source circuit enters the first interconnect coil via first conductive trace 170 positioned on first semiconductor die 110 and propagates through its plurality of wires 150, 152, 154, 156, 158, and 159 and returns to first semiconductor die 110 via fourth conductive trace 176. This alternating current induces current or voltage on the second interconnect coil connected to the load circuit. The induced current or voltage is transferred to the load circuit via first and fourth conductive traces 196, 199 positioned on second semiconductor die 120.

The conductive traces may include nickel-coated copper, nickel-coated aluminum, or aluminum and provide for electrical connectivity on semiconductor dies 110, 120 and isolating blocks 130, 140, which are generally not conductive. The conductive traces may be connected to the plurality of wires via ball bonds, for example.

Figure 2:
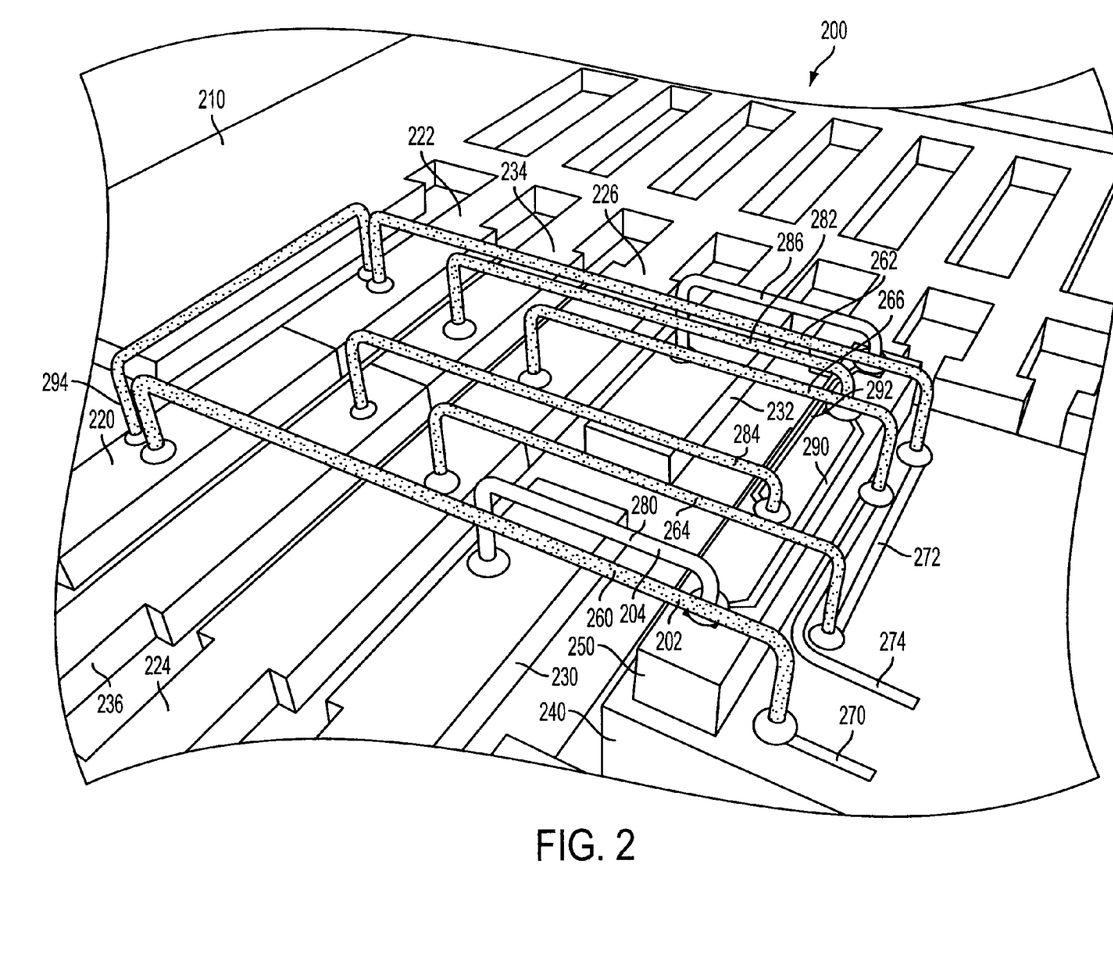
FIG. 2 illustrates a perspective view of an exemplary semiconductor device including two suspended-isolating interconnect coils enabling transfer of electrical energy between a circuit on a semiconductor die and a printed circuit board on a lead frame.

In the second exemplary implementation, a transformer may be formed between a semiconductor die and a lead frame, rather than between two semiconductor dies. In particular, FIG. 2 illustrates a perspective view of an exemplary semiconductor device 200 including two suspended-isolating interconnect coils enabling transfer of electrical energy between a first circuit located on a first semiconductor die and a printed circuit board located on a lead frame. The semiconductor device 200 includes a lead frame 210, a semiconductor die 240, an isolating block 250, a first interconnect coil and a second interconnect coil.

The lead frame 210 includes a first set of leads (leads 220, 222, 224, and 226) and a second set of leads (leads 230, 232, 234, and 236) which are isolated from each other. The semiconductor die 240 is positioned on lead frame 210. For example, semiconductor 240 may be positioned on a die pad located on lead frame 210 and may provide a support for isolating block 250. The isolating block 250 is positioned on semiconductor die 240 and is configured to isolate semiconductor die 240 from lead frame 210.

The semiconductor device 200 includes first and second interconnect coils 202, 204. The first interconnect coil 202 is formed by a first set of wires (wires 260, 262, 264, and 266), semiconductor die, and the first set of leads (leads 220, 222, 224, and 226). The second interconnect coil 204 is formed by a second set of wires (wires 280, 282, 284, and 286), isolating block 250, and the second set of leads (leads 230, 232, 234, and 236).

The first and second interconnect coils 202, 204 are mutually positioned to form a transformer inside an IC package, thereby enabling a printed circuit board connected to lead frame 210 to communicate with a circuit located on semiconductor die 240. To this end, the first set of leads includes a first lead 220 and a second lead 222 each of which is conductive and connected to each other at their end tips, and the first set of wires includes a first wire 260 and a second wire 262. At one end, first and second wires 260, 262 are coupled to each other via first lead 220 and second lead 222 and, at the other end, respectively connected to first and second conductive traces 270, 272 positioned on the top surface of semiconductor die 240. Alternatively, another conducing wire 294 may bridge across first and second leads 220, 222.

In each case, the first set of leads further includes a third lead 224 and a fourth lead 226 each of which is conductive and connected to each other at their ends. The first set of wires further includes a third wire 264 and a fourth wire 266. At one end, third and fourth wires 264, 266 are connected to each other via third lead 224 and fourth lead 226. At the other end, the third wire is connected to second wire 262 via second conductive trace 272 positioned on the top surface of semiconductor die 240 and fourth wire 266 is connected to a third conductive trace 274 positioned on the top surface of semiconductor die 240.

Similarly, the second set of leads includes a first lead 230, a second lead 232, a third lead 234, and a fourth leads 236, each of which is conductive and third and fourth leads 234, 236 connect to each other at their ends. Similarly, the second set of wires includes a first wire 280, a second wire 282, a third wire 284, and a fourth wire 286. The first and second wires 280, 282 connect to each other at one end via a first conductive trace 290 positioned on the top surface of isolating block 250. At the other end, first wire 280 connects to first lead 230 and second wire 282 connects to third lead 234. Similarly, third and fourth wires 284, 286 connect to each other at one end via a second conductive trace 292 positioned on the top surface of isolating block 250. At another end, third wire 284 connects to fourth lead 236 and fourth wire 286 connects to second lead 232.

With the foregoing configuration, similar to the first implementation described with respect to FIGS. 1A-1B, the first and second interconnect coils form a transformer within the IC package, thereby enabling transfer of electrical energy from one circuit to another through the inductively coupled electrical wires. The source circuit may be located on a semiconductor die 240. However and in contrast to the first implementation, the load circuit may be located on a printed circuit board coupled to a lead frame 210 rather than on a semiconductor die as in FIGS. 1A-1B. As such, a transformer is formed between lead frame 210 and semiconductor die 240.

In each case, the alternating current generated from the source circuit enters the first interconnect coil via first conductive trace 270 positioned on semiconductor die 240 and propagates through its wires 260, 262, 264, and 266 and return to semiconductor die 240 via third conductive trace 274. This alternating current induces current or voltage on the second interconnect coil coupled to the load circuit. The induced current or voltage is transferred to the load circuit via leads 230, 232.

In the foregoing manners, the present application removes the coupling away from the silicon surfaces to provide effective isolation while still providing an electrical interconnect. Other implementation are contemplated. For example, the present application can provide for a variation of level of interconnect connectivity based on the number of wires in each interconnect coil. This variation can be set at the time of manufacturing process using inherent wire bonding flexibility. Other implementations are also contemplated.

What is claimed is:

1. A semiconductor device configured to provide current and voltage isolation inside an integrated circuit package, the semiconductor device comprising:
    a first semiconductor die and a second semiconductor die;
    a first isolating block positioned on the first semiconductor die;
    a second isolating block positioned on the second semiconductor die;
    a first interconnect coil having a plurality of wires connecting the first semiconductor die to the second isolating block, and
    a second interconnect coil having a plurality of wires connecting the second semiconductor die to the first isolating block.

2. The semiconductor device of claim 1, wherein:
    the plurality of wires of the first interconnect coil includes a first wire and a second wire, at one end connected to each other via a first conductive trace positioned on the top surface of the second isolating block and, at another end respectively connected to first and second conductive traces positioned on the top surface of the first semiconductor die, each of the first wire and second wire connecting the first semiconductor die to the second isolating block, and the plurality of wires of the second interconnect coil includes a first wire and a second wire, at one end connected to each other via a first conductive trace positioned on the top surface of the first isolating block and, at another end respectively connected to first and second conductive traces positioned on the top surface of the second semiconductor die, each of the first wire and second wire connecting the second semiconductor die to the first isolating block.

3. The semiconductor device of claim 1, wherein the first and second interconnect coils are isolated from each other and suspended.

4. The semiconductor device of claim 1, wherein the first and second interconnect coils are surrounded by a molding compound.

5. The semiconductor device of claim 1, wherein the first and second interconnect coils are configured to carry high voltages.

6. The semiconductor device of claim 1, wherein the first and second interconnect coils are mutually positioned such that capacitance coupling is created between the first and second interconnect coils.

7. The semiconductor device of claim 1, wherein the first and second interconnect coils are mutually positioned to form a transformer in the semiconductor device.

8. The semiconductor device of claim 1, wherein the first interconnect coil is connected to a source circuit located on the first semiconductor die and the second interconnect coil is connected to a load circuit located on the second semiconductor die such that an alternating current applied to the first interconnect coil via the source circuit induces a current or voltage on the second interconnect coil connected to the load circuit.

9. The semiconductor device of claim 1, wherein the plurality of wires of the second interconnect coil is wrapped around the plurality of wires of the first interconnect coil.

10. The semiconductor device of claim 1, wherein the plurality of wires of the second interconnect coil is inside the plurality of wires of the first interconnect coil.

11. The semiconductor device of claim 1, wherein the plurality of wires of the second interconnect coil is adjacent the plurality of wires of the first interconnect coil.

12. The semiconductor device of claim 2, wherein the plurality of wires of the first interconnect coil further includes a third wire and a fourth wire, at one end connected to each other via a second conductive trace positioned on the top surface of the second isolating block and, at another end the third wire is connected to the second wire via the second conductive trace positioned on the top surface of the first semiconductor die and the fourth wire is connected to a third conductive trace positioned on the top surface of the first semiconductor die.

13. The semiconductor device of claim 2, wherein the plurality of wires of the second interconnect coil further includes a third wire and a fourth wire, at one end connected to each other via a second conductive trace positioned on the top surface of the first isolating block and, at another end the third wire is connected to the second wire via the second conductive trace positioned on the top surface of the second semiconductor die and the fourth wire is connected to a third conductive trace positioned on the top surface of the second semiconductor die.

14. The semiconductor device of claim 2, wherein the conductive traces include nickel-coated copper, nickel-coated aluminum, or aluminum.

15. The semiconductor device of claim 2, wherein the plurality of wires of the first and second interconnect coils are connected to the conductive traces via ball bonds.

16. The semiconductor device of claim 1, wherein the plurality of wires of the first interconnect coil and the plurality of wires of the second interconnect coil are made of copper, gold, or aluminum.

17. The semiconductor device of claim 1, wherein the first semiconductor die includes thereon a first circuit and the second semiconductor die includes thereon a second circuit such that the first and second circuits communicate with each other though the first and second interconnect coils.

18. A semiconductor device configured to provide current and voltage isolation inside an integrated circuit package, the semiconductor device comprising:
a lead frame including a first set of leads and a second set of leads, the first set of leads being isolated from the second set of leads;
a semiconductor die positioned on the lead frame;
an isolating block positioned on the semiconductor die;
a first interconnect coil formed by a first set of wires, connecting the semiconductor die, and the first set of leads; and
a second interconnect coil isolated from the first interconnect coil and formed by a second set of wires, connecting the isolating block the second set of leads.

19. The semiconductor device of claim 18, wherein the first and second interconnect coils are configured to enable a printed circuit board connected to the lead frame to communicate with a circuit located on the semiconductor die.

20. The semiconductor device of claim 18, wherein:
the first set of leads includes a first lead and a second lead each of which is conductive and connected to each other at its end tip portion, and
the first set of wires includes a first wire and a second wire, at one end connected to each other via the first lead and the second lead and, at another end respectively connected to first and second conductive traces positioned on the top surface of the semiconductor die.

21. The semiconductor device of claim 20, wherein:
the first set of leads further includes a third lead and a fourth lead each of which is conductive and connected to each other at its end tip portion, and
the first set of wires further includes a third wire and a fourth wire, at one end connected to each other via the third lead and the fourth lead and, at another end the third wire is connected to the second wire via the second conductive trace positioned on the top surface of the semiconductor die and the fourth wire is connected to a third conductive trace positioned on the top surface of the semiconductor die.

22. The semiconductor device of claim 18, wherein:
the second set of leads includes first, second, third, and fourth leads each of which is conductive and the third and fourth leads connect to each other at their end tip portion,
the second set of wires includes first, second, third, and fourth wires,
the first and second wires, at one end connect to each other via a first conductive trace positioned on the top surface of the isolating block and, at another end the first wire connect to the first lead and the second wire connect to the third lead, and
the third and fourth wires, at one end connect to each other via a second conductive trace positioned on the top surface of the isolating block and, at another end the third wire connect to the fourth lead and the fourth wire being connected to second lead.

23. The semiconductor device of claim 18, wherein the first and second interconnect coils are isolated from each other and suspended.

24. The semiconductor device of claim 18, wherein the first and second interconnect coils are surrounded by a molding compound.

25. The semiconductor device of claim 18, wherein the first and second interconnect coils are configured to carry high voltages.

26. The semiconductor device of claim 18, wherein the first and second interconnect coils are mutually positioned such that capacitance coupling is created between the first and second interconnect coils.

27. The semiconductor device of claim 18, wherein the first and second interconnect coils are mutually positioned to form a transformer in the semiconductor device.

28. The semiconductor device of claim 18, wherein the first interconnect coil is connected to a circuit located on the first semiconductor die and the second interconnect coil is connected to a printed circuit board connected to the lead frame, such that the first and second interconnect coils enable the printed circuit board to communicate with the circuit located on the semiconductor die.

29. The semiconductor device of claim 18, wherein the first set of wires of the first interconnect coil is wrapped around the second set of wires of the second interconnect coil.

30. The semiconductor device of claim 18, wherein the first set of wires of the first interconnect coil is inside the second set of wires of the second interconnect coil.

31. The semiconductor device of claim 18, wherein the first set of wires of the first interconnect coil is adjacent to the second set of wires of the second interconnect coil.

32. The semiconductor device of claim 20, wherein the conductive traces include nickel-coated copper, nickel-coated aluminum, or aluminum.

33. The semiconductor device of claim 20, wherein the first set of wires of the first interconnect coils is connected to the conductive traces via ball bonds.

34. The semiconductor device of claim 18, wherein the first set of wires of the first interconnect coil and the second set of wires of the second interconnect coil are made of copper, gold, or aluminum.

* * * * *